US010072879B1

(12) United States Patent
El-Kady et al.

(10) Patent No.: US 10,072,879 B1
(45) Date of Patent: Sep. 11, 2018

(54) METHOD AND APPARATUS OF ENHANCED THERMOELECTRIC COOLING AND POWER CONVERSION

(71) Applicants: National Technology & Engineering Solutions of Sandia, LLC, Albuquerque, NM (US); Los Alamos National Security, LLC, Los Alamos, NM (US)

(72) Inventors: Ihab Fathy El-Kady, Albuquerque, NM (US); Charles M Reinke, Albuquerque, NM (US); Roy H. Olsson, Albuquerque, NM (US); Brian S. Swartzentruber, Albuquerque, NM (US); Collin J. Delker, Albuquerque, NM (US); Jinkyoung Yoo, Los Alamos, NM (US)

(73) Assignees: National Technology & Engineering Solutions of Sandia, LLC, Albuquerque, NM (US); Los Alamos National Security, LLC, Los Alamos, NM (US)

( * ) Notice: Subject to any disclaimer, the term of this patent is extended or adjusted under 35 U.S.C. 154(b) by 377 days.

(21) Appl. No.: 14/691,441

(22) Filed: Apr. 20, 2015

(51) Int. Cl.
*F25B 21/02* (2006.01)
*H01L 35/12* (2006.01)
*H01L 35/14* (2006.01)
*H01L 35/32* (2006.01)
*H01L 23/38* (2006.01)
*H01L 35/22* (2006.01)

(52) U.S. Cl.
CPC .............. *F25B 21/02* (2013.01); *H01L 35/32* (2013.01); *H01L 23/38* (2013.01); *H01L 35/22* (2013.01)

(58) Field of Classification Search
CPC ......... H01L 35/32; H01L 23/38; H01L 35/22; F25B 21/02
USPC ................................ 257/930; 136/236.1, 239
See application file for complete search history.

(56) References Cited

U.S. PATENT DOCUMENTS

| 6,000,225 A * | 12/1999 | Ghoshal | F25B 21/02 62/3.7 |
| 6,256,996 B1 * | 7/2001 | Ghoshal | B82Y 15/00 136/203 |
| 6,282,907 B1 * | 9/2001 | Ghoshal | F25B 21/02 257/E23.082 |

(Continued)

FOREIGN PATENT DOCUMENTS

WO    WO 2007115954 A1 * 10/2007    ........... H01L 21/845

OTHER PUBLICATIONS

C.J. Delker et al., "Current and Noise Properties of InAs Nanowire Transistors With Asymmetric Contacts Induced by Gate Overlap", IEEE Trans. Electr. Dev., vol. 61, No. 3 (Mar. 2014) pp. 884-889.

(Continued)

*Primary Examiner* — Filip Zec
(74) *Attorney, Agent, or Firm* — Martin I. Finston

(57) ABSTRACT

Methods and apparatus for removing heat from an object for the purpose of cooling or for the purpose of generating electrical power are disclosed. In an embodiment, at least two field-effect transistors (FETs) are operated under inversion. While the FETs are being operated, heat is conducted from the object through body portions of said FETs to an element configured for dissipating the conducted heat.

14 Claims, 14 Drawing Sheets

(56) References Cited

U.S. PATENT DOCUMENTS

| | | | | |
|---|---|---|---|---|
| 6,468,887 | B2 * | 10/2002 | Iwasa | H01L 21/28273 257/E21.209 |
| 6,588,217 | B2 * | 7/2003 | Ghoshal | H01L 23/38 257/E23.082 |
| 7,293,416 | B2 * | 11/2007 | Ghoshal | F25B 21/02 62/3.2 |
| 8,106,381 | B2 * | 1/2012 | Atanackovic | H01L 21/28194 257/18 |
| 8,653,599 | B1 * | 2/2014 | Cheng | H01L 21/845 257/351 |
| 2007/0095378 | A1 * | 5/2007 | Ito | B60N 2/5657 136/203 |
| 2008/0023803 | A1 * | 1/2008 | Shi | H01L 29/045 257/623 |
| 2008/0178920 | A1 * | 7/2008 | Ullo | E21B 47/011 136/204 |
| 2010/0032748 | A1 * | 2/2010 | Edwards | H01L 21/823814 257/327 |
| 2011/0233512 | A1 * | 9/2011 | Yang | B82Y 10/00 257/9 |
| 2013/0187680 | A1 * | 7/2013 | Martens | H03K 19/20 326/104 |
| 2015/0270503 | A1 * | 9/2015 | Luessem | H01L 51/002 257/40 |

OTHER PUBLICATIONS

K.A. Jenkins et al., "Characteristics of SOI FET's Under Pulsed Conditions, IEEE Transactions on Electron Devices", vol. 44, No. 11 (Nov. 1997) pp. 1923-1930.

L.D. Hicks et al., "Effect of quantum-well structures on the thermoelectric figure of merit", Physical Review B, vol. 47, No. 19 (May 1993) pp. 12 727-12 731.

A. Wettstein, "Quantum Effects in MOS Devices" (Apr. 2000), www.iis.ee.ethz.ch/~schenk/theses/wettstein.pdf, 151 pages.

C.T. Sah et al., "The Scattering of Electrons by Surface oxide Charges and by Lattice Vibrations at the Silicon-Silicon Dioxide Interface", Surface Science vol. 32 (1972) pp. 561-575.

J. Moon et al., :Gate-Modulated Thermoelectric Power Factor of Hole Gas in Ge-Si Core-Shell Nanowires, Nano Letters vol. 13 (2013) pp. 1196-1202.

S.M. Sze et al., "Physics of Semiconductor Devices", Third Edition, Wiley-Interscience (2007), Chapter 4, pp. 197-249 and Chapter 6, pp. 250-373.

* cited by examiner

METHOD AND APPARATUS OF ENHANCED THERMOELECTRIC COOLING AND POWER CONVERSION

STATEMENT REGARDING FEDERALLY SPONSORED RESEARCH

This invention was developed under Contract DE-AC04-94AL85000 between Sandia Corporation and the U.S. Department of Energy. The U.S. Government has certain rights in this invention.

FIELD OF THE INVENTION

The invention relates to thermoelectric cooling devices and thermoelectric generators.

ART BACKGROUND

The phenomenon of thermoelectric cooling has been known since its discovery in 1834 by J. C. A. Peltier. Briefly, a junction between two dissimilar conductors will absorb or evolve heat when a current of respectively one direction or the other flows through it. In the cooling direction, the amount of heat absorbed per unit electric current per unit time is, roughly speaking, given by the product TS where T is the absolute temperature and S is the Seebeck coefficient or "thermopower". The Seebeck coefficient, which is different for different materials and may be temperature-dependent, is defined as the entropy flux per unit charge at the Fermi level. A useful but less rigorous definition is the rate of change of electrical potential with temperature, where the potential is the steady-state open-circuit voltage between the ends of a conductor to which a temperature gradient has been applied, the temperature variable is the difference in temperature between the two ends, and the sign of S is positive when the potential becomes more negative with rising temperature.

The efficiency of a thermoelectric material is closely related to the dimensionless figure of merit ZT, where $Z=S^2\sigma/\kappa$, and $\sigma$ and $\kappa$ are respectively the electrical and thermal conductivities of the material. The efficiencies of known thermoelectric materials are currently much too low for thermoelectric heaters and coolers to serve as a practical substitute for mechanical heat pumps and refrigeration systems. According to one rule of thumb, ZT would have to be greater than 3 before such substitutions could become practical. Typical values for the ZT of high-performing thermoelectric materials are in the range 0.5-2.0, with values as high as 2.4 reported for specially structured materials.

In the quest for more efficient thermoelectric cooling, there have been various attempts to modify material properties in order to increase ZT. Because it has proven difficult to modify S, many published attempts have aimed to reduce the thermal conductivity $\kappa$. This approach, however, has encountered fundamental limitations because the thermal and electrical conductivities are closely interrelated. In particular, efforts to reduce $\kappa$ by incoherent phonon scattering have often also led to the unintentional scattering of electrons, which concomitantly reduces $\sigma$ and therefore nullifies some or all of the advantage gained by reducing $\kappa$.

Hence there remains a need for new material systems with properties that lead to still greater thermoelectric efficiency.

SUMMARY OF THE INVENTION

We have found a new way to enhance the Seebeck coefficient S and consequently the thermoelectric efficiency of a cooling system. Our approach takes advantage of the distribution of quantum states in a two-dimensional electron gas (2DEG) and two-dimensional hole gas (2DHG), which can be created in field-effect transistor structures.

According to the Mott formula, which is well known to those skilled in the art, S is proportional to the rate of change of DOS with respect to energy, as evaluated at the Fermi level. DOS is the electronic density of states. In a two-dimensional electron or hole gas, quantum confinement effects tend to increase DOS near the Fermi level, which in turn drives up the value of S.

We have found that by operating a field-effect transistor structure under inversion, we can create a 2DEG or 2DHG that exhibits quantum confinement effects leading to enhanced values of S. Under those conditions, substantially all of the electrical conduction takes place in a very thin inversion layer adjacent to the gate oxide. Meanwhile, most of the thermal conduction takes place through the transistor body underlying the inversion layer. Hence the electrical and thermal paths are substantially decoupled. This opens the possibility of further enhancing S by fabricating the transistor body in a low-$\kappa$ semiconductor such as silicon-germanium alloy (SiGe).

An application of our invention of potentially very great importance is the cooling of microelectronic chips, because thermoelectric coolers of the kind described here can be monolithically integrated with functional microelectronic circuits.

Accordingly, the invention in a first aspect is embodied in a cooling method that comprises operating a field-effect transistor (FET) in thermal communication with an article to be cooled. The FET has an inversion layer which may, e.g. be induced by an externally applied gate voltage or induced by the electric field of a fixed, implanted gate charge. In operation, electric current is driven through the FET such that the current is substantially confined to the inversion layer. The current is driven in a direction that causes heat to be removed from the article.

As is well known in the art, thermoelectric coolers are constructed so that conductive elements having different Seebeck coefficients are arranged in thermally parallel, electrically series-connected pairs. Accordingly, the invention in some embodiments comprises a pair of FETs as described above. One FET of the pair is an n-channel FET and the other is a p-channel FET. Each FET of the pair has a respective induced inversion layer, and electric current is driven through both FETs of the pair in series.

In further embodiments, electric current is driven through each of a plurality of FET pairs as described above.

The invention in another aspect is embodied in a thermoelectric cooling apparatus comprising at least one n-channel FET and at least one p-channel FET thermally parallel to the n-channel FET and electrically connected to it in series. In various embodiments, the FET may be, for example, a planar FET, a microwire FET, a nanowire FET, or a FIN-FET.

In some embodiments, a plurality of n-channel FETs are paired with respective p-channel FETs, and the respective FETs in each said pair are thermally parallel and electrically connected to each other in series. In further embodiments, the FET pairs are arranged in two or more thermally parallel stages, each stage including at least one pair of thermally parallel and electrically series-connected FETs.

In particular embodiments, the FETs are metal-oxide-semiconductor FETs (MOSFETs).

In another aspect, the invention is embodied in methods and apparatus for electrical power generation. That is, apparatus substantially as described above can be operated in a reverse sense, in which the conduction of heat through the FETs from a hot body to a cold body results in the output of an electric current through a resistive load connected to the FETs.

DETAILED DESCRIPTION

Figure 1:
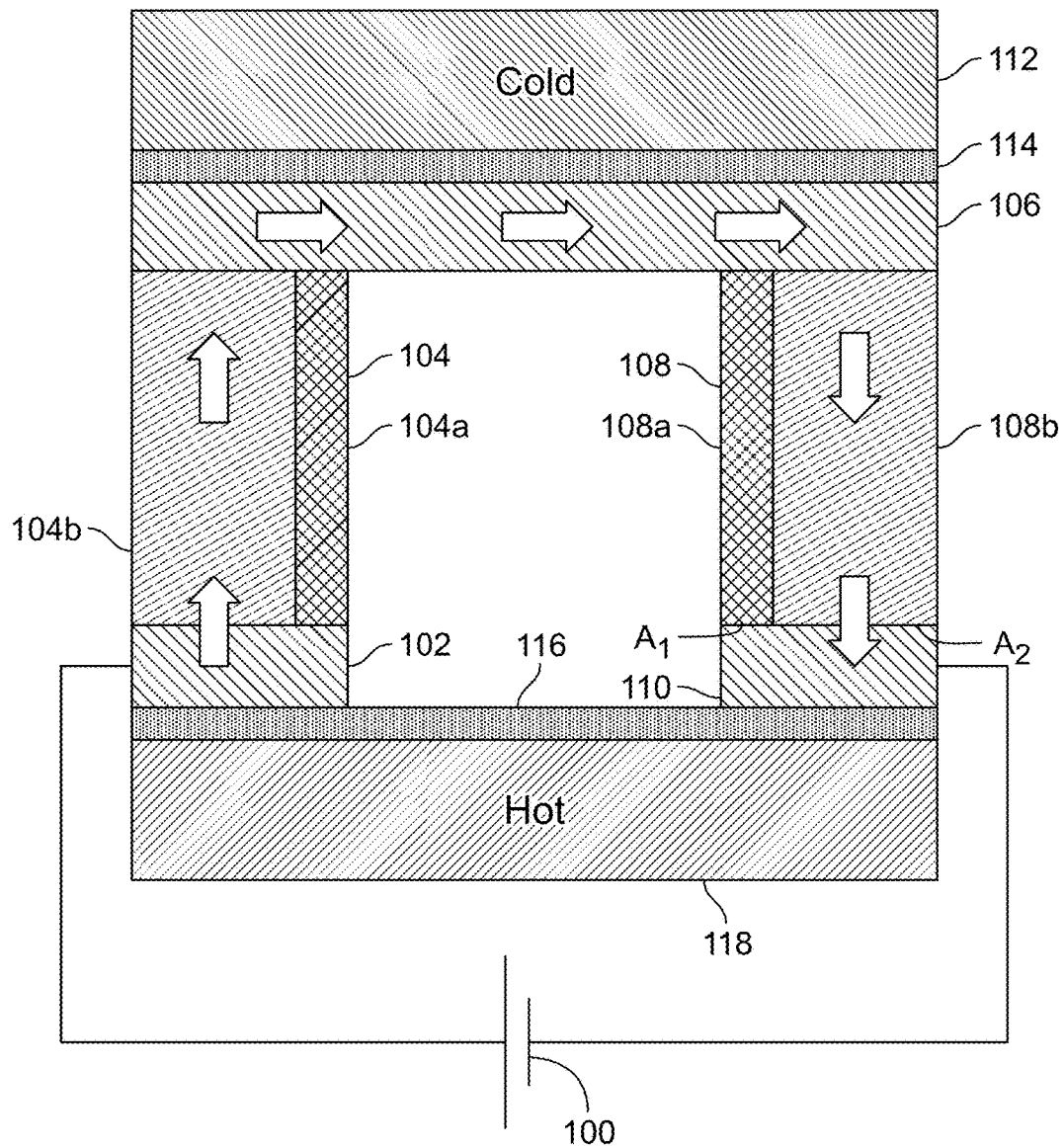
FIG. 1 provides a schematic view of a typical thermoelectric cooling arrangement of the prior art.

FIG. 1 provides a schematic view of a typical thermoelectric cooling arrangement in which an electric current from source 100 passes from metal contact 102 through thermoelectric element 104, then through metal contact 106, then through thermoelectric element 108, and then through metal contact 110 and back into source 100. Heat is absorbed from cold-side metal plate 112 through thin insulating sheet 114 into metal contact 106, which defines the contact region between the respective thermoelectric elements. Heat that is evolved at contacts 102 and 110 passes through thin insulating sheet 116 into hot-side metal plate 118, from which it is dissipated by convection and/or by radiation.

As shown in the figure, each of the thermoelectric elements is partitioned into a subelement 104a, 108a having an area in cross section to the direction of current flow $A_1$ and a subelement 104b, 108b having an area in cross section to the direction of current flow $A_2$. Let us assume that for thermoelectric element 104, subelement 104a has a Seebeck coefficient $S_1$ and an electrical conductivity $\sigma_1$, and that subelement 104b has a Seebeck coefficient $S_2$ and an electrical conductivity $\sigma_2$. Similar assumptions are made for the respective Seebeck coefficients and electrical conductivities of the subelements of thermoelectric element 108. Let us also assume that $A_1<A_2$. We introduce the symbol $\beta$ for the ratio of $A_1$ to $A_2$; that is, $\beta=A_1/A_2$.

Under the above assumptions, an effective Seebeck coefficient $S_{eff}$ can be found for element 104 (and likewise element 108) taking into account its composite nature. Such an effective Seebeck coefficient may be expressed by:

$$S_{eff} = \frac{\beta S_1 \sigma_1 + S_2 \sigma_2}{\beta \sigma_1 + \sigma_2}.$$

It will be evident from the above expression that if $\beta$ is small, that is if $A_1$ is much smaller than $A_2$, then increasing $S_1$ to values modestly greater than $S_2$ will not appreciably improve the effective Seebeck coefficient unless $\sigma_1$ is much greater than $\sigma_2$. In our approach, we increase $S_1$ by creating a 2D electron or hole gas in respective semiconductor regions corresponding to subelements 104a and 108a of the figure. The electrical conductivity is in fact greater in the 2D electron and hole gases than it is in the bulk semiconductor. However, by using our approach it is also possible to use junction effects to electrically isolate the bulk semiconductor region, and in that way to reduce the effective value of $\sigma_2$ to values far below the conductivity of the bulk semiconductor.

Figure 2:
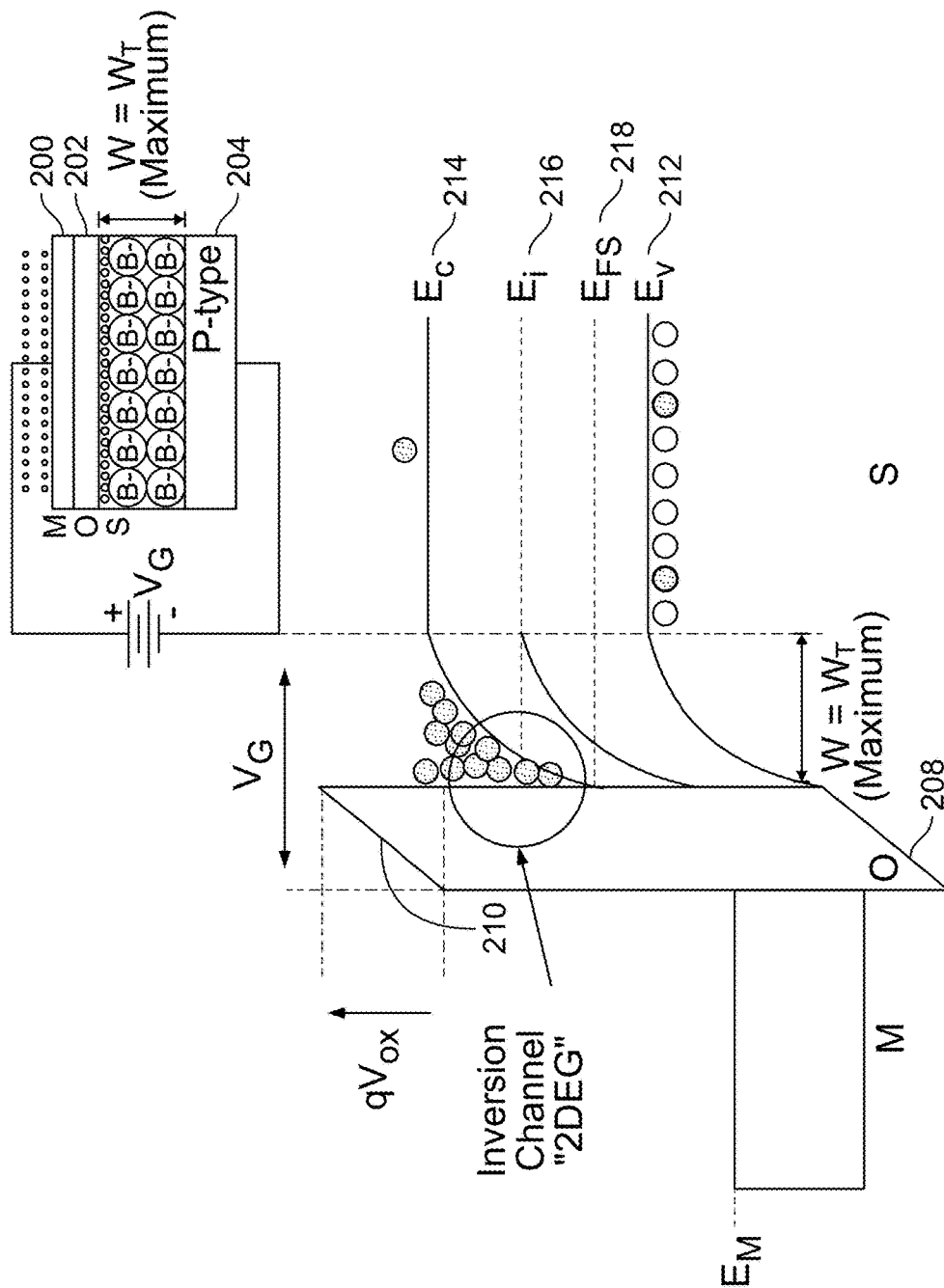
FIG. 2 schematically illustrates the induction of 2D electron and hole gases in the context of an MOS capacitor.

By way of introduction, we will first discuss the induction of 2D electron and hole gases in the context of an MOS capacitor as illustrated in FIG. 2. As seen in the figure, a metal gate electrode 200 is juxtaposed to a gate dielectric 202, which in turn is juxtaposed to a p-type semiconductor 204. A schematic energy-band diagram is included in the figure. The band diagram indicates the top 208 of the valence band and the bottom 210 of the conduction band of the gate dielectric, the top 212 of the valence band and the bottom 214 of the conduction band of the semiconductor, and the intrinsic Fermi level 216 and the as-doped Fermi level 218 of the semiconductor. A positive gate voltage $V_G$ is applied to the gate electrode, which has the effect of bending the semiconductor electronic energy bands down as the dielectric-semiconductor interface is approached from the direction of the bulk semiconductor. The metal work function is indicated in the figure as $E_M$. The energy drop across the oxide is indicated in the figure as $qV_{ox}$, where −q is the electronic charge.

The gate voltage is directed so as to sweep holes, i.e. the majority carriers, away from the dielectric-semiconductor interface, thus creating a depletion region. However, the figure shows a condition that is reached when the (positive) gate voltage reaches a threshold. For sufficient gate voltage, a potential well is created near the interface where conduction electrons (which here are the minority carriers) accumulate to form an electron gas. As the width W of the potential well is typically only a few nanometers, the electrons that it contains will exhibit quantum mechanical behavior typical of a 2D electron gas. Similar behavior can be seen in an n-type MOS capacitor subjected to a strong enough negative gate voltage.

The quantum confinement effect is most advantageously utilized in a transistor configuration where the gate is used to create an inversion channel. In the transistor configuration, the pn junctions are useful to prevent the carriers from moving through the body of the device. Hence, the body can be electrically isolated from the 2D carrier gas.

Accordingly, we will now turn to implementations of the invention in which an MOS transistor configuration is used in place of the MOS capacitor configuration described above. The MOS transistor is operated under inversion. The gate is shorted to the source or, optionally, to the body. A threshold implant is performed to provide an electric field that induces strong inversion even with zero applied gate voltage. (In other embodiments, an applied gate voltage may be relied on to induce the inversion.)

Figure 3:
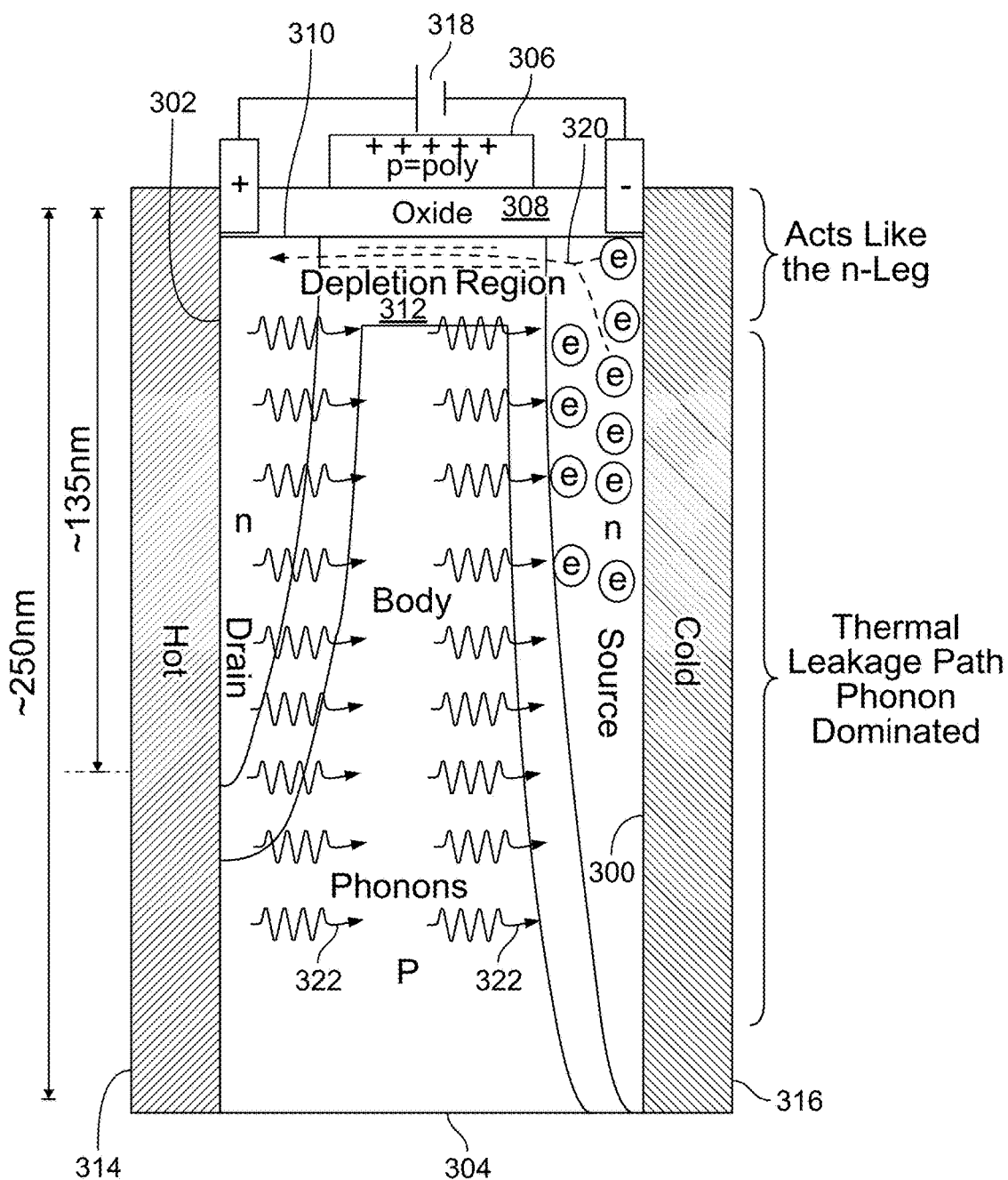
FIG. 3 is a schematic, cross-sectional diagram of an inversion n-channel MOSFET that is useful in implementations of the present invention.

FIG. 3 is a schematic, cross-sectional diagram of an inversion n-channel MOSFET that can be fabricated using well-known processes of CMOS fabrication. As shown in the figure, the MOSFET has a source 300, a drain 302, a body 304, a polysilicon gate electrode 306, and a silicon oxide gate dielectric 308. An inversion layer 310 is seen underlying and adjacent to the gate dielectric. Shown directly beneath the inversion layer and extending downward between the source and the body and between the drain and the body is depletion region 312.

A thermal gradient applied to the device is indicated in the figure by hot boundary element 314 and cold boundary element 316. (As used below, the term "thermal gradient" should generally be understood as connoting a temperature difference as measured, e.g., in degrees, rather than a spatial derivative of temperature.) In the cooling configuration, a source-drain voltage $V_{DS}$, indicated in the figure by battery symbol 318, is applied opposite to the thermal gradient across the device. It will be understood in this regard that the positive direction of the thermal gradient is from cold to hot (corresponding to right-to-left in the figure), and the positive direction of the electric field is from high potential to low potential (corresponding to left-to-right, or drain-to-source in the figure).

The illustrated structure is doped n-p-n, as indicated in the figure. The depletion region 312, together with an associated potential barrier at the source/body and drain/body junctions, forms as a consequence of the dopant profile. The presence of the depletion region and potential barriers results in the complete electrical isolation of body 304, so that electronic diffusion driven by $V_{DS}$ must follow a path, e.g. path 320 of the figure, that traverses the inversion channel 310.

Meanwhile, because inversion channel 310 is extremely narrow relative to the full depth of body 304, the thermal conduction will be dominated by phonons 322 traversing the body region from the drain to the source. Hence the effective values of S and σ across the device will be representative of inversion channel 310, whereas the effective value of κ will be representative of body 304. Such a delamination of the electrical path from the thermal path differentiates the MOSFET configuration from the MOS capacitor described above. Such a delamination also makes it possible, among other things, to independently engineer the respective values of S, σ, and κ in at least some implementations. Each of these three parameters will be addressed individually in the following discussion.

As will be understood by those skilled in the art, the effective values $\sigma_{eff}$, $\kappa_{eff}$, and $S_{eff}$ of the electrical conductivity, the thermal conductivity, and the Seebeck coefficient scale according to the following formulas:

$$\sigma_{eff} = \frac{A_1 \cdot \sigma_1 + A_2 \cdot \sigma_2}{A_1 + A_2},$$

$$\kappa_{eff} = \frac{A_1 \cdot \kappa_1 + A_2 \cdot \kappa_2}{A_1 + A_2},$$

$$S_{eff} = \frac{(A_1 \cdot \sigma_1)S_1 + (A_2 \cdot \sigma_2)S_2}{(A_1 \cdot \sigma_1) + (A_2 \cdot \sigma_2)},$$

where $A_1$ and $A_2$ are the respective channel and body cross sectional areas normal to the transport direction, $\sigma_1$ and $\sigma_2$ are the respective channel and body electrical conductivities, $\kappa_1$ and $\kappa_2$ are the respective channel and body thermal conductivities, and $S_1$ and $S_2$ are the respective channel and body Seebeck coefficients.

The usual approach to increasing σ in a semiconductor is to increase the doping concentration. However, this typically also leads to a decrease in S, which is undesirable for thermoelectric applications. In our new approach, by contrast, the electric field due to the gate voltage attracts electric charges from the body and concentrates them within the narrow inversion channel. As a consequence, the local value of σ is increased relative to the body before inversion without changing the doping, and hence also without changing the base value of S of the system. The field that induces the inversion layer may be provided by an externally applied gate voltage, or in alternative designs it may be provided by ion implantation of fixed gate charges according to known methods.

Our approach to increasing S relies on the effects of quantum confinement. As mentioned earlier, S is proportional to the rate of change of DOS with respect to energy as evaluated at the Fermi level, where DOS is the electronic density of states. Recourse to the simple parabolic model for the dispersion relation provides a useful basis for understanding how S is affected by quantum confinement. Further details of the argument to be presented below may be found, e.g., in L. D. Hicks and M. S. Dresselhaus, "Effect of quantum-well structures on the thermoelectric figure of merit", in *Physical Review B*, Vol. 47 (1993) 12727-12731.

The dispersion relation for a bulk system is given in the parabolic model by:

$$\varepsilon_{3D}(k_x, k_y, k_z) = \frac{\hbar^2 k_x^2}{2m_x^*} + \frac{\hbar^2 k_y^2}{2m_y^*} + \frac{\hbar^2 k_z^2}{2m_x^*} \quad (3)$$

where m* and k are the effective electronic mass and momentum in each of the respective directions denoted by the subscripts x, y, and z.

For a 2D quantum well system of width a confining the electrons along the z-direction, the third term in Eq. (3) reduces to the expression for the energy of a particle in a quantum box. The parabolic model as modified for that two-dimensional case yields:

$$\varepsilon_{2D}(k_x, k_y, k_z) = \frac{\hbar^2 k_x^2}{2m_x^*} + \frac{\hbar^2 k_y^2}{2m_y^*} + \frac{n^2 \hbar^2 \pi^2}{2m_z^* a^2} \quad (4)$$

where n (=1, 2, . . . ) is the energy quantum number.

Because the wavefunction is now quantized relative to the $k_z$ direction, some classically accessible low-lying energy states are now forbidden. This forces the electrons to occupy higher energy states closer to the Fermi surface.

Figure 4:
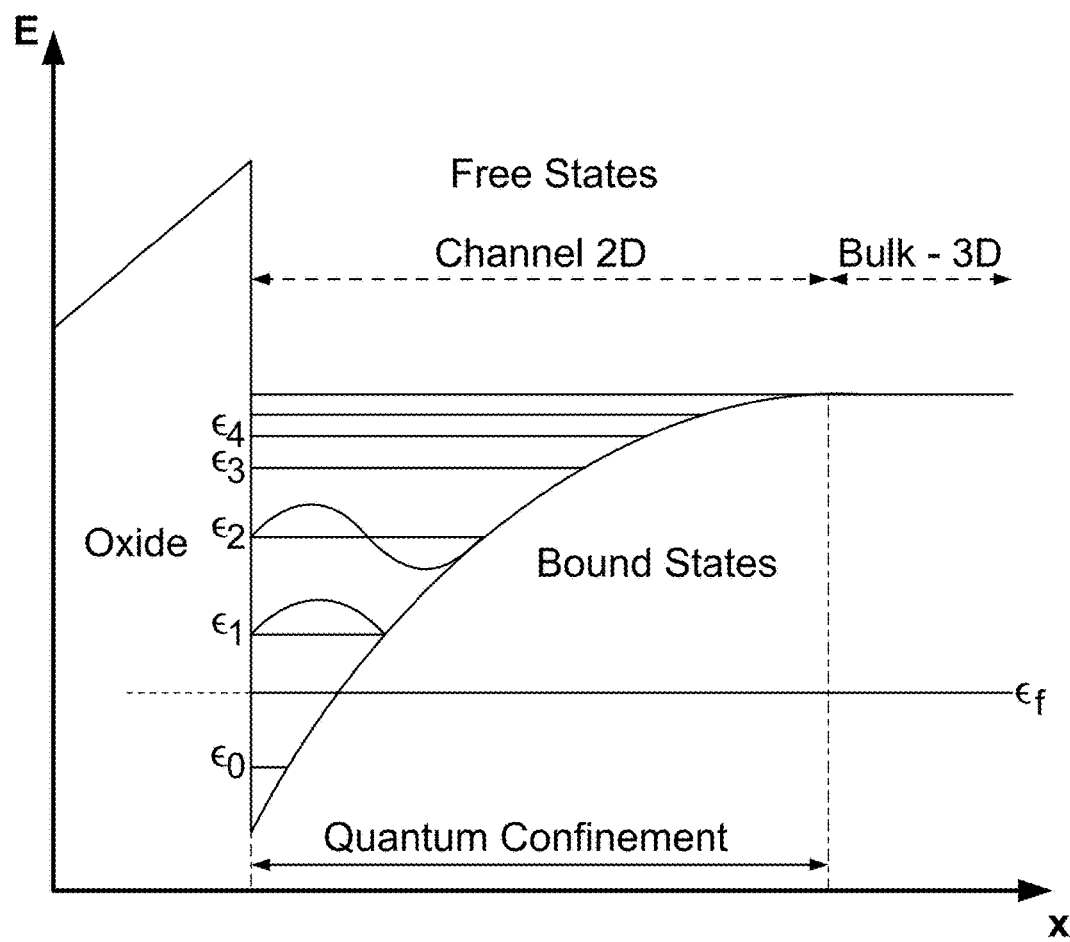
FIG. 4 schematically illustrates the distribution of bound-state energy levels in the potential well created by inversion in a semiconductor device such as the MOSFET of FIG. 3.

It also happens that the density of states increases as the energy of the levels increases. Although this is not readily apparent from the simplistic parabolic model, it can be seen from the more realistic energy diagram shown in FIG. 4, where x represents depth into the device, $\in_f$ is the Fermi level, and $\in_0$, $\in_1$, $\in_2$, $\in_3$, $\in_4$, etc. are bound states of the potential well created by inversion. As seen, the sidewall of the potential well has a gradual roll-off which results in the eigenstates growing closer together in energy as the quantum number increases. Another factor that contributes to the increasing density of states is the degeneracy of the eigenstates, which on average increases with increasing quantum number.

Because the density of states is expected to rise relative to the 3D case as the Fermi level is approached from below, an enhancement in the 2D Seebeck coefficient would also be expected, relative to the 3D case.

Under the simple models presented here, the Seebeck coefficients are given by:

$$S_{3D} = -\frac{k_B}{e}\left(\frac{5F_{\frac{3}{2}}(\mu)}{3F_{\frac{1}{2}}(\mu)} - \frac{\mu}{k_B T}\right), \quad (5)$$

$$S_{2D} = -\frac{k_B}{e}\left(\frac{2F_1(\mu)}{F_0(\mu)} - \frac{\mu}{k_B T} + \frac{\hbar^2 \pi^2}{2m_z a^2 k_B T}\right)$$

where $$F_i(\mu) = \int_0^\infty \frac{x^i \, dx}{\exp(x-\mu)+1}$$

is the Fermi-Dirac distribution function and μ is the chemical potential.

Eq. (5) indicates that $S_{2D} \geq S_{3D}$ for all possible values of the width a of the quantum well, with $S_{2D} = S_{3D}$ only in the limit of very large a. However, it is important to realize that Eq. (5) is valid only in the regime where the electron levels are quantized. This restricts the maximum well thickness to approximately the de Broglie wavelength of the electron, i.e. to a≤10 nm.

Figure 5:
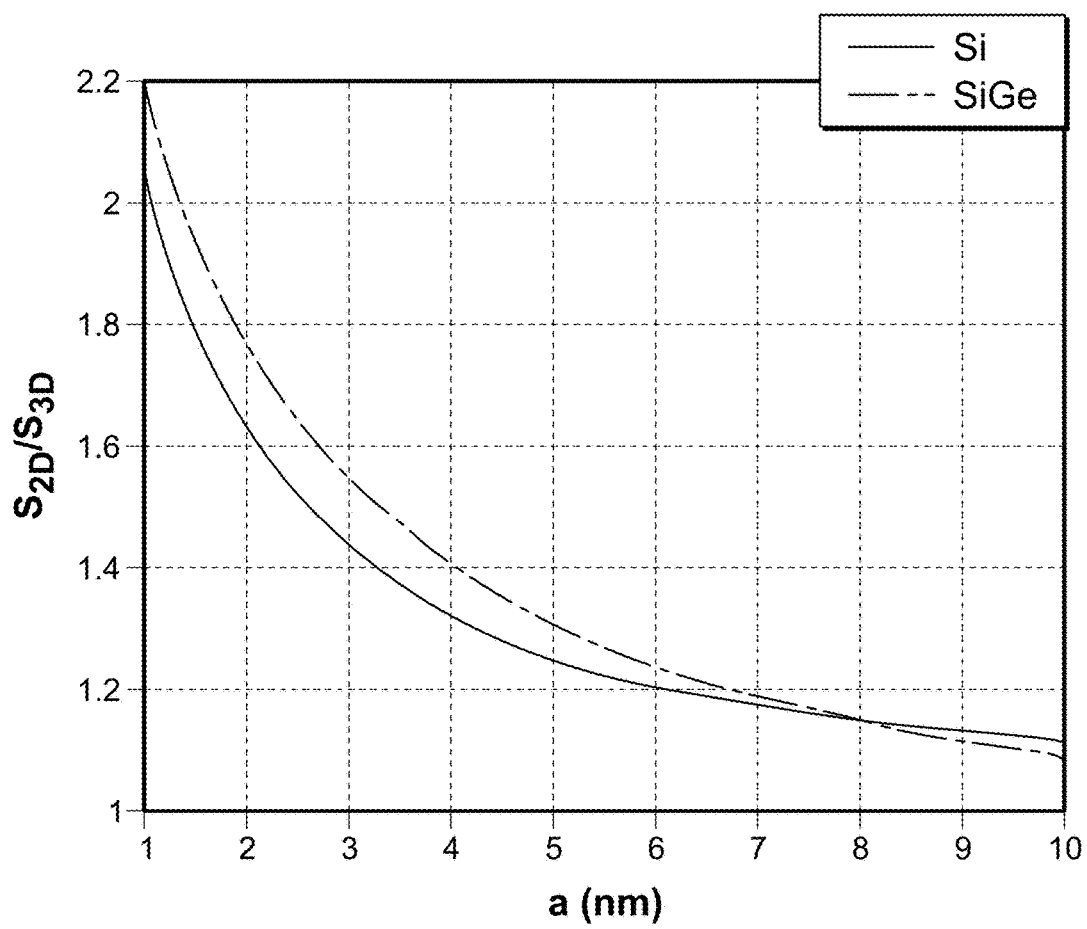
FIG. 5 provides a theoretical plot of the ratio of the quantum-confined Seebeck coefficient to the bulk Seebeck coefficient as a function of the quantum-well thickness a for two material systems. The SiGe material system is represented in the upper plot, and the silicon material system is represented in the lower plot of the figure.

FIG. 5 provides a plot of the calculated ratio $S_{2D}/S_{3D}$ versus the quantum-well thickness a for two material systems: SiGe in the upper plot and silicon in the lower plot.

Other researchers have shown that under strong inversion, the inversion channel of a MOSFET can be made as narrow as 3-6 nm. As this thickness is well below the 10-nm limit estimated above as the cutoff set by the de Broglie wavelength of the electron, we believe that quantum confinement effects will be readily observable in such an inversion channel. In particular, we expect that both an enhanced value of S and a relatively high value of a in the channel can occur concurrently.

Because thermal conduction is dominated by the bulk behavior of the transistor body, a straightforward approach to reducing κ is to select for the body an inherently low-κ semiconductor that is compatible with the CMOS fabrication process and that also has favorable thermoelectric properties. One example of such a semiconductor is SiGe. A MOSFET having a body of SiGe may be fabricated in a conventional planar geometry or in, e.g., a core-shell nanowire geometry. It should be borne in mind, however, that such a choice of material system is meant only to be exemplary, and not to be limiting as to the scope of the present invention.

Figure 6:
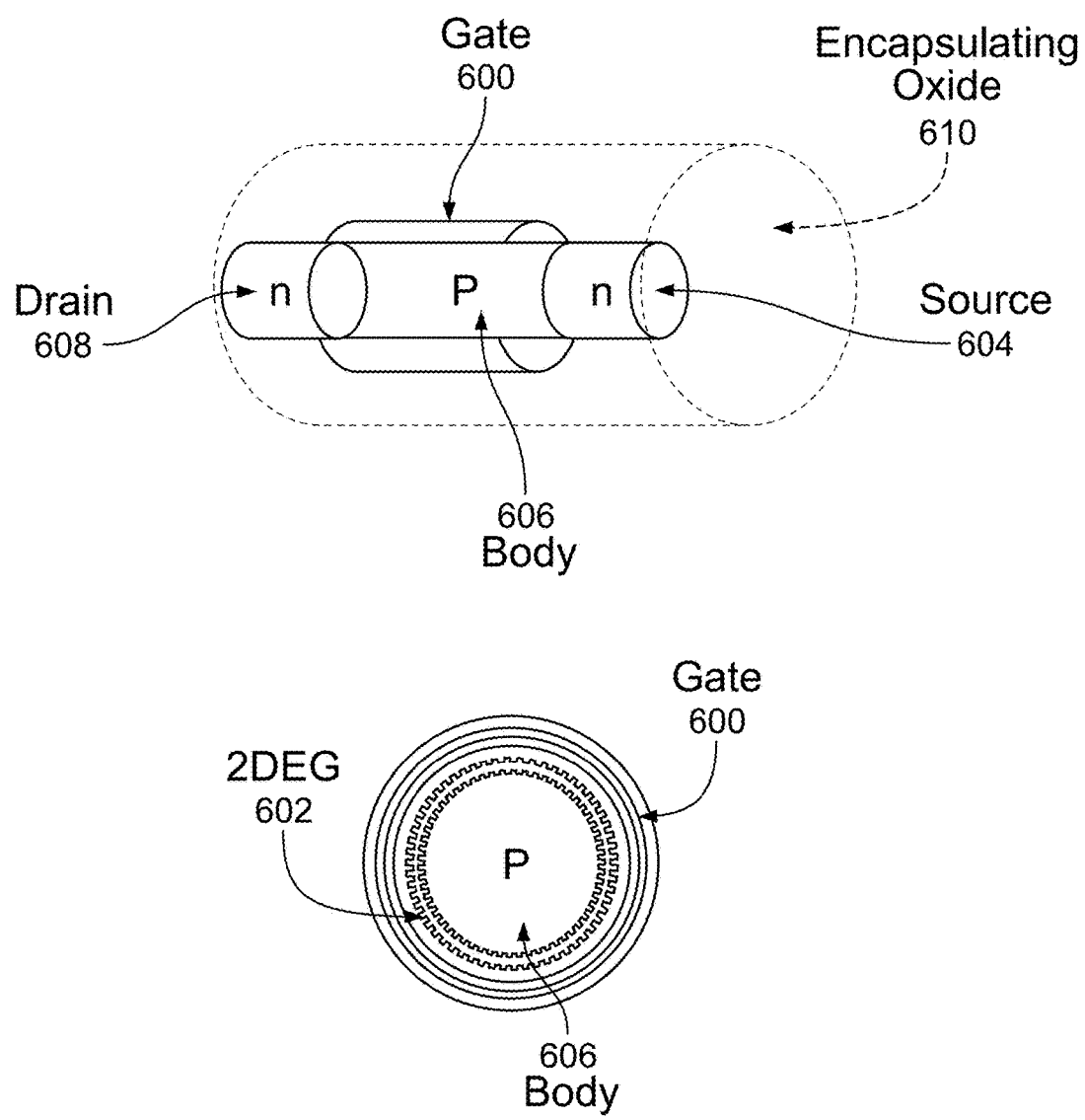
FIG. 6 provides a partially schematic representation of an n-channel, SiGe core-shell, nanowire MOSFET with a wrap-around gate and a cylindrical inversion channel. Such a device is useful for the practice of the invention in some embodiments. View (a) of FIG. 6 is a slightly rotated side view of the nanowire MOSFET and View (b) is an end-on cross-sectional view.

By way of example, views (a) and (b) of FIG. 6 respectively provide a schematic side view and a schematic end-on cross sectional view of a SiGe core-shell nanowire MOSFET with a wrap-around gate 600 and a cylindrical inversion channel 602. The example shown is an n-channel device including source 604, body 606, drain 608, and encapsulating oxide layer 610. In this regard, the term "wrap-around gate" should be understood as including gates that wrap partially around the nanowire in, for example, an omega (Ω) shaped conformation. Such gates have proven simpler to fabricate than fully circular wraparound gates, and are expected to be effective in the present context.

In the nanowire configuration, the wrap-around gate will lead to an inversion channel in the form of a cylindrical shell near the outer rim of the wire. Continuing the simple energy modeling presented above, we note that the quantized energy of the cylindrical sheet in the radial direction attains a functional form similar to that of the 2D quantum well in the squeezed dimension (i.e., the k dimension), namely, $$E_n = \frac{\hbar^2}{2m}\left(\frac{n\rho_0}{R}\right)^2, \rho_0 = 2.4048,$$

n=1, 2, . . . . This suggests that the treatment of S presented above for a planar quantum well remains valid to within proportionality factors. Typical nanowire diameters fall in the range 20-100 nm, although substantially larger structures are also possible.

It should be borne in mind that although silicon has too high a thermal conductivity to be an optimal material for the applications contemplated here, it is still a viable choice of material system, not least because of its ubiquity, its relatively low cost, and the ease with which the structures described here can be fabricated in silicon. It is noteworthy in this regard that the detrimental effects of a thermal "short circuit" caused by conduction through a silicon transistor body can be mitigated by SOI fabrication techniques. That is, the silicon MOSFET may be fabricated in a thin SOI wafer with a device layer of, e.g., 100 nm thickness or less. We have estimated that because of quantum size effects that limit phonon transport, using a thin SOI wafer can halve the value of the thermal conductivity of the transistor body relative to a bulk CMOS device. In examples, we estimated a relatively low effective thermal conductivity for the transistor body of about 70 W/mK.

Three parameters are often put forward for quantifying the performance of thermoelectric devices: The figure of merit ZT, the maximum sustainable steady-state temperature gradient across the cooler $\Delta T_{max@Q=0}$, and the maximum rate of heat removal assuming no temperature gradient $Q_{max@\Delta T=0}$. We estimated the values of $\Delta T_{max@Q=0}$ and $Q_{max@\Delta T=0}$ for an exemplary SiGe single-MOSFET structure and for an exemplary silicon single-MOSFET structure at each of two different device thicknesses. The results, which will be discussed below, are presented in FIGS. 7 and 8.

The rate Q of heat removal by a thermoelectric device is expressed by the following equations:

$$ZT = \frac{(S_n - S_p)^2 T}{\left(\sqrt{\kappa_n/\sigma_n} + \sqrt{\kappa_p/\sigma_p}\right)^2}, \quad (7)$$

$$Q = (S_n - S_p)IT_c - \frac{1}{2}RI^2 - G(T_H - T_c),$$

$$P = (S_n - S_p)\Delta TI + RI^2$$

where $S_n$ and $S_p$ are the respective Seebeck coefficients of the n-channel and p-channel transistors forming a thermoelectric junction, G is the thermal conductance, P is the input power, the subscripts "H" and "C" denote the hot and cold sides, T is the average temperature, R is the electrical resistance, and I is the current.

Values for $\Delta T_{max@Q=0}$ and $Q_{max@\Delta T=0}$ are readily obtained from Eq. (7) combined with specific values for the Seebeck coefficients and the electrical and thermal conductivities.

For our calculations, we assumed that the silicon device had a doping level of about $10^{17}$ cm$^{-3}$ and the SiGe device had a doping level of about $10^{19}$ cm$^{-3}$. Using formulas and data published in the literature, we estimated the thermoelectric parameters presented in Table 1.

TABLE 1

| Material | $\sigma_{Channel}$ (Siemens/cm) | $\kappa_{Body}$ (W/mK) | $S_{3D} = S_{body}$ (µV/K) | $S_{Channel}$ (µV/K) | $ZT_{room}$ |
|---|---|---|---|---|---|
| Silicon | 259.7 | 70 | 1100 | 1485 | Approx. 0.3 |
| SiGe | 466.6 | 1.1 | 175 | 245 | Approx. 0.8 |

Figure 7:
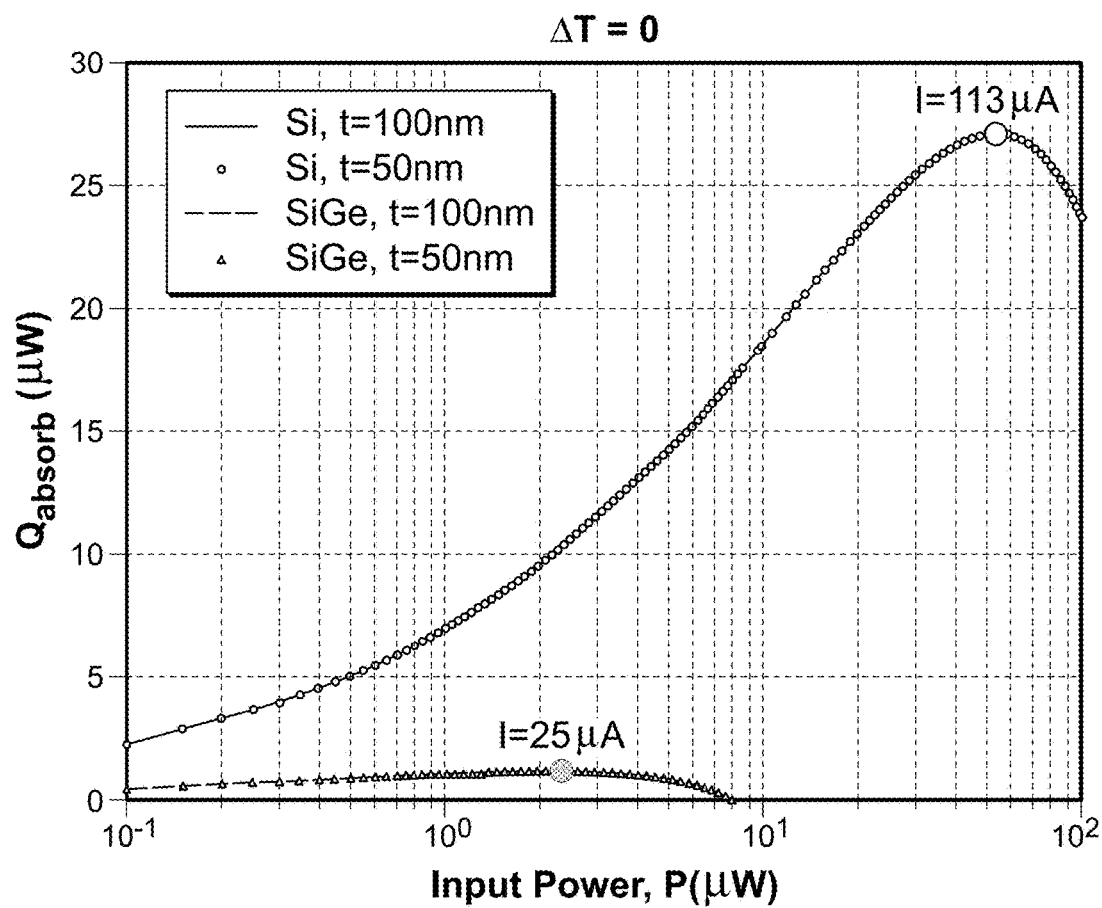
FIG. 7 is a graph of the rate $Q_{absorb}$ of heat removal at zero temperature gradient (i.e., at $\Delta T=0$) as a function of input power to an illustrative MOSFET structure. The upper plot in the figure represents a silicon structure, and the lower curve represents a SiGe structure.

FIG. 7 is a graph of the rate $Q_{absorb}$ of heat removal at zero temperature gradient (i.e., at $\Delta T=0$) as a function of input power to the MOSFET structure, as calculated using the thermoelectric parameters of Table 1. The upper plot in the figure represents the silicon structure, and the lower curve represents the SiGe structure. Each plot is a composite of solid curves that were calculated for a silicon or SiGe thickness of 100 nm and discrete data points that were calculated for a silicon or SiGe thickness of 50 nm. It will be seen that in each case, the data for the 50-nm layer fall on the same curve as the data for the 100-nm layer. This reflects the fact that absent a temperature gradient, there is no effect due to the thermal conductance.

Figure 8:
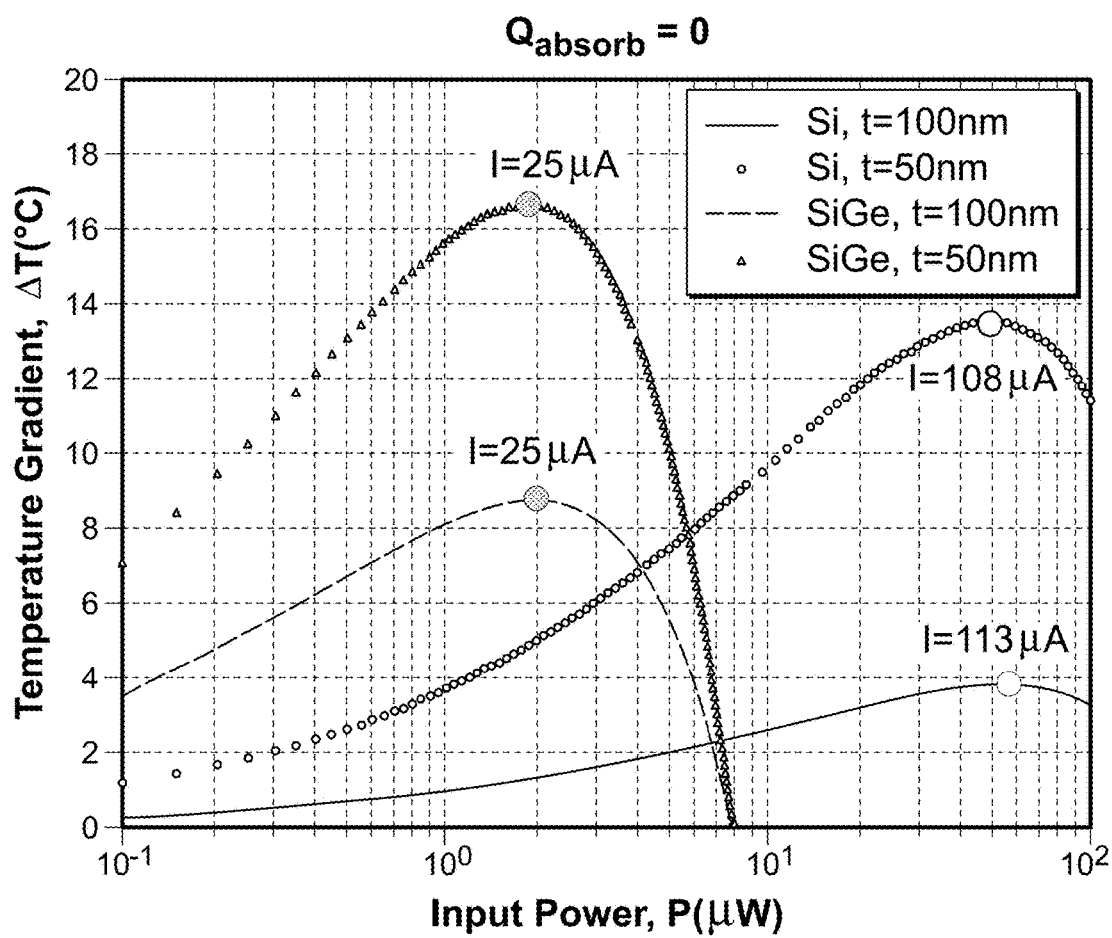
FIG. 8 is a graph of the temperature gradient $\Delta T$ as a function of input power to the illustrative MOSFET structure, as calculated using the thermoelectric parameters of Table 1 under conditions of no heat removal, i.e. for $Q_{absorb}=0$. The two curves that peak in the right-hand portion of the figure represent a silicon structure, and the two curves that peak near the center of the figure represent a SiGe structure. For each pair of curves, the upper curve represents a device thickness of 50 nm and the lower curve represents a device thickness of 100 nm.

FIG. 8 is a graph of the temperature gradient $\Delta T$ as a function of input power to the MOSFET structure, as calculated using the thermoelectric parameters of Table 1 under conditions of no heat removal, i.e. for $Q_{absorb}=0$. Four curves are visible in the figure. The two curves that peak in the right-hand portion of the figure represent the silicon structure, and the two curves that peak near the center of the figure represent the SiGe structure. For each pair of curves, the upper curve represents a device thickness of 50 nm and the lower curve represents a device thickness of 100 nm. On each curve in FIGS. 7 and 8, we have indicated the electric current that, when driven through the MOSFET structure, corresponds to the input power that yields optimal thermoelectric behavior.

Reference to FIGS. 7 and 8 shows that the SiGe structure would be considered more favorable for sustaining a relatively high temperature gradient. The figures indicate that a $\Delta T_{max@Q=0}$ of about 16° C. is possible. Reference to the same figures also shows that the silicon structure would be considered more favorable for achieving a relatively high rate of heat removal. The figures indicate that a $Q_{max@\Delta T=0}$ of about 25 µW per MOSFET module is possible.

Figure 9:
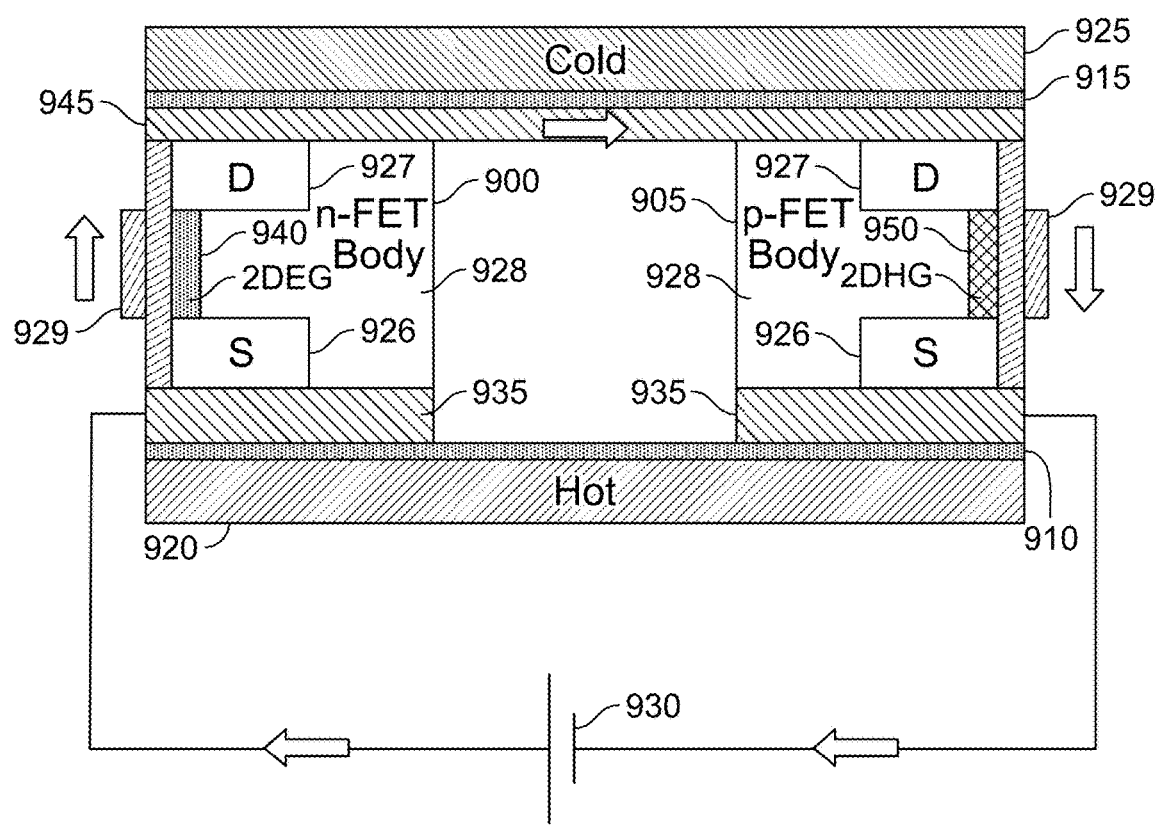
FIG. 9 is a schematic diagram illustrating a cooling arrangement of two MOSFETs that may be useful for practicing the invention in some embodiments. An alternative mode of operation is also illustrated, whereby the MOSFETs generate electric power.

One example of a practical arrangement of inversion-channel MOSFETs for cooling is illustrated in FIG. 9. The arrangement shown there is similar to the arrangement, using conventional elements, that is shown in FIG. 1. As presented in FIG. 9, the arrangement includes n-channel FET 900 and p-channel FET 905, both of which are enclosed between thin insulating sheets 910, 915 and respective hot-side and cold-side metal plates 920, 925. Each FET has a source 926, a drain 927, a body 928, and a gate 929. It will be understood that the graphical representation of the FETs is schematic and should not be taken as a realistic depiction.

Electric current from power source 930 passes through contact 935 into n-channel FET 900. The current passes through 2D electron gas region 940 and exits FET 900 into conductor 945, from which the current enters p-channel FET 905. The current passes through 2D hole gas region 950 and exits from FET 905 into contact 955, from which it returns to power source 930.

Those skilled in the art will understand that the rate of heat removal scales in proportion with the number of thermoelectric cooling devices that are deployed, and that the temperature differential $\Delta T$ can be increased by using multiple thermoelectric stages. Hence the results shown in FIGS. 7 and 8 indicate that practical cooling of electronic circuits can be achieved by packing multiple MOSFET-based thermoelectric coolers in staged arrangements on an integrated circuit wafer. Such an arrangement would be built up from basic cells, each consisting of a thermally parallel, electrically series-connected pair of MOSFET or other FET structures, one being an n-channel structure and the other a p-channel structure.

Figure 10:
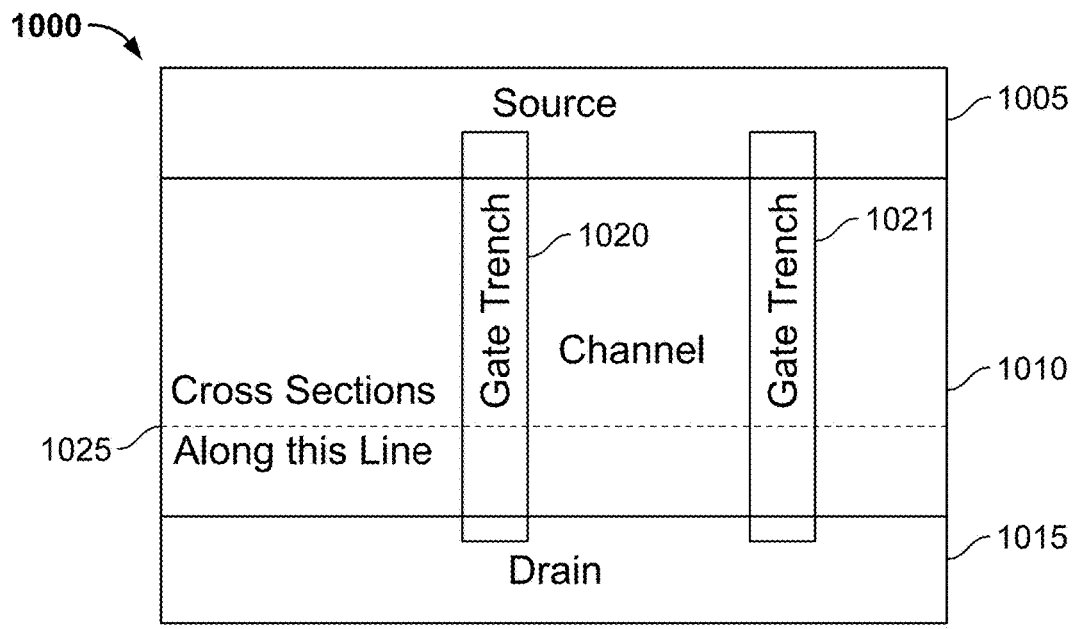
FIG. 10 provides two views of a MOSFET device structure that is useful in implementations of the present invention. View (a) is a partially schematic, top-down plan view in which the source is visible at the top and the drain is visible at the bottom. A broken horizontal line seen near the middle of View (a) indicates the position of a plane, oriented perpendicularly to the plane of View (a), which intersects the device structure to provide the cross-sectional shown in View (b) of FIG. 10. In View (b), the observer's line of sight extends from the drain region toward the source region. Elements of View (b) that correspond to elements of View (a) are indicated with like reference numerals.
Figure 10:
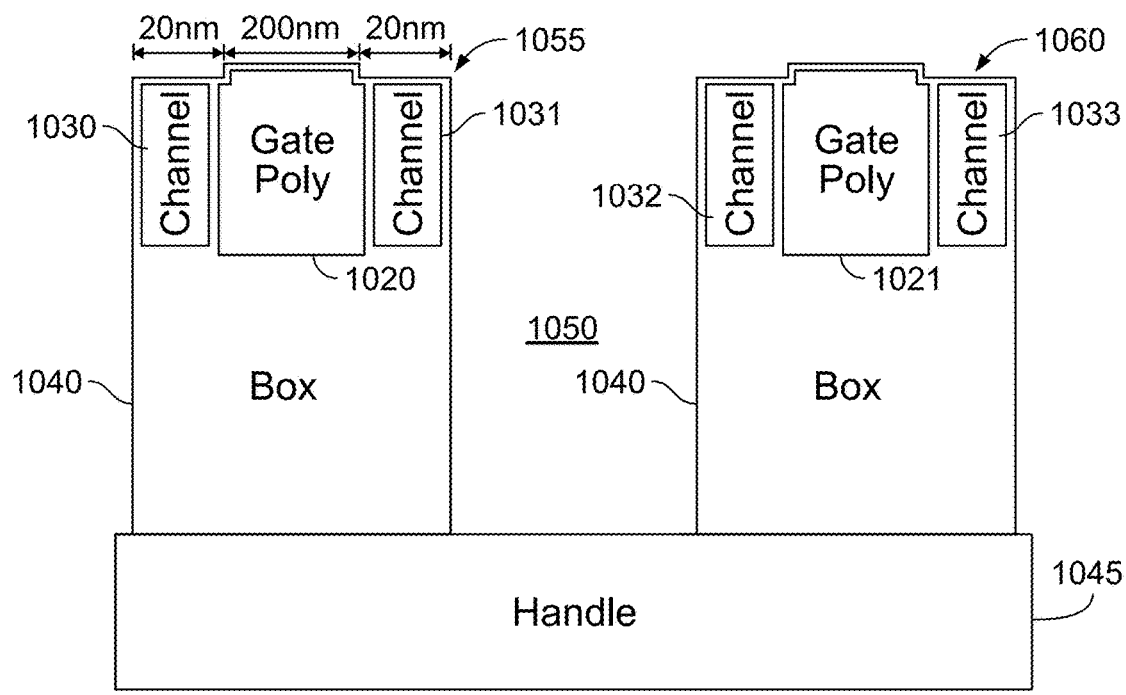

View (a) of FIG. 10 provides a schematic, top-down plan view of a MOSFET device structure 1000 that can be made using a standard CMOS process flow with a device thickness as low as 50 nm. Visible in the figure are source region 1005, channel region 1010, and drain region 1015. Also visible are the outlines of two trenches 1020, 1021 which are filled with polysilicon to form the gate electrodes of two adjacent MOSFET structures. Broken line 1025 in the figure indicates the position of a plane, oriented perpendicularly to the plane of View (a), which intersects the device structure to provide the cross-sectional shown in View (b) of the figure.

Turning now to View (b) of FIG. 10, seen there is a cross-sectional plan view of device structure 1000, as viewed from the position of plane 1025. The observer's line of sight in View (b) extends from the drain region toward the source region. Elements of View (b) that correspond to elements of View (a) are indicated with like reference numerals. Drain region 1015 is not seen in the figure because it is behind the position of the observer. Source region 1005 is not seen because it is hidden in the back of the figure.

Gate trenches 1020 and 1021 are visible in View (b). As shown, they are filled with the gate polysilicon. Also shown in View (b) are portions 1030, 1031, 1032, and 1033 of channel region 1010 of View (a). Buried oxide (BOX) 1040 is shown underlying the channel and gate regions, and SOI handle layer 1045 is shown underlying the BOX layer. As indicated in the figure, the channel regions are exemplarily 20 nm wide in the direction transverse to channel conduction, the gate electrode is exemplarily 200 nm wide in the same direction, and the gate trenches are repeated with a pitch of about 240 nm.

Figure 11:
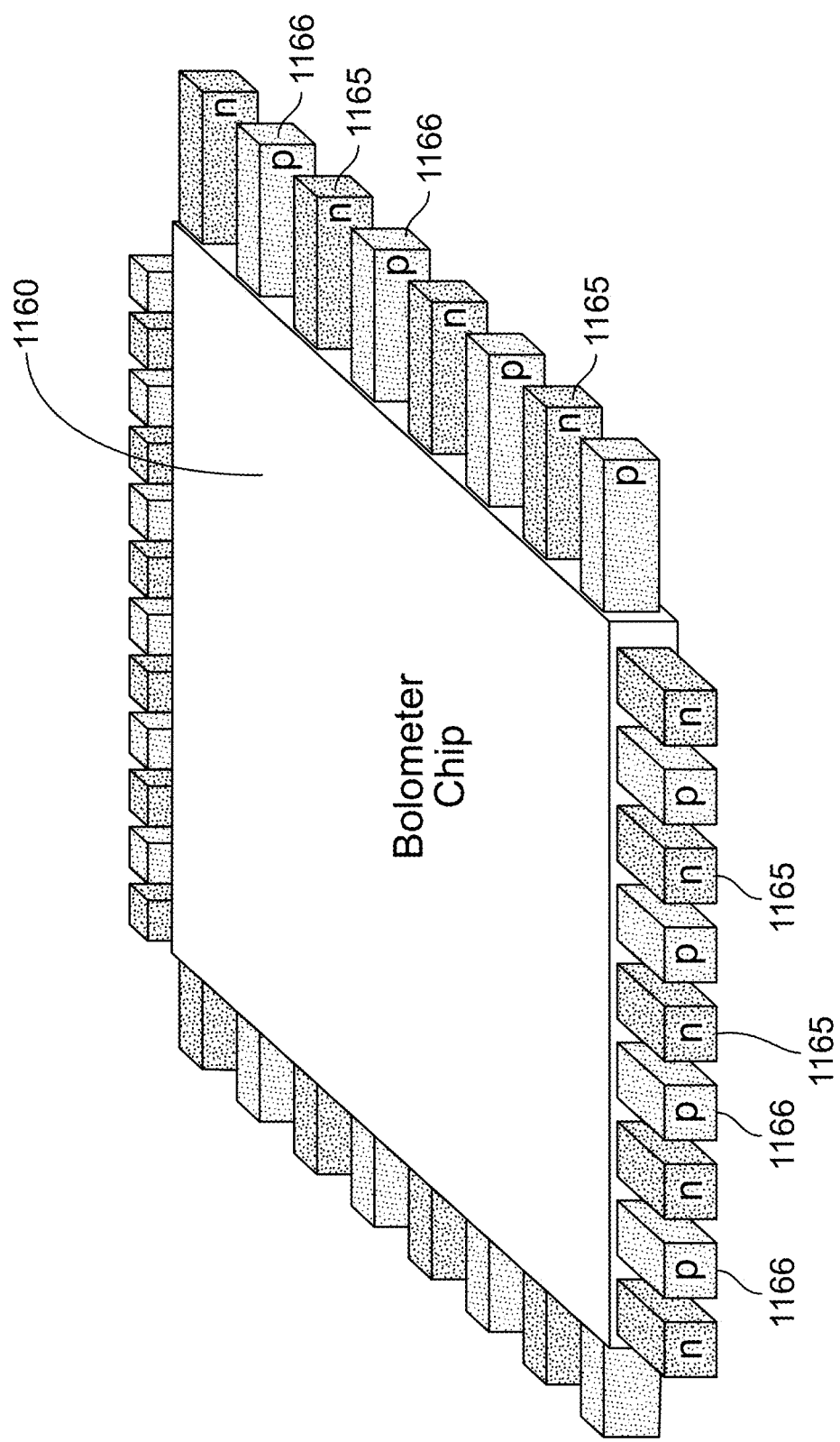
FIG. 11 provides a partially schematic perspective view of a functional chip that is arrayed along all four sides with cooling MOSFETs according to an embodiment of the present invention.

With a structure as illustrated, it would be possible to array 20,000 cooling silicon MOSFETs on each side of a 1-cm square die. Such an arrangement could remove heat from the die at a total rate of two watts. By way of illustration, FIG. 11 provides a schematic perspective view of a functional chip 1160, such as a bolometer chip, that is arrayed along all four sides with cooling MOSFETs. As indicated in the figure, the cooling MOSFETs alternate between n-channel devices 1165 and p-channel devices 1166 so as to provide the series-connected pairs necessary for cooling.

The vertical depth of the channel can be made as small as 50 nm. In the conduction direction, it is advantageous to make the channel as long as possible, in order to sustain the largest possible temperature gradient. In typical implementations, the channel will be several hundred nanometers long.

In some implementations the polysilicon gate electrode could be in direct contact with the channel, although for MOSFET implementations it would be more typical to include a thin intervening gate dielectric layer, generally an oxide layer, between the gate electrode and the channel. The gate trenches preferably extend to the full body depth, e.g. to 50 nm in a thin device.

An inversion channel can be created directly by the gate implant. That is, in some implementations the implant creates a permanent gate charge that induces an inversion channel even without a bias voltage applied to the gate.

As seen in View (b) of FIG. 10, a layer 1050 of, e.g., oxide intervenes between left-hand device element 1055 and right-hand device element 1060.

As also seen in View (b) of FIG. 10, each gate electrode controls two channels, one to its left in the figure view and one to its right. For example, gate electrode 1020 controls channels 1030 and 1031, and gate electrode 1021 controls channels 1032 and 1033. All channels controlled by a given gate are of the same conductivity type. Duplication of channels increases the total effective channel cross sectional length. This increases the energy transport, hence boosts the cooling efficiency.

In some implementations, three or more channels can be controlled by a single gate electrode. This is possible, for example, in FIN-FET implementations in which a thin silicon fin provides a wraparound gate that controls the conducting channel.

Figure 12:
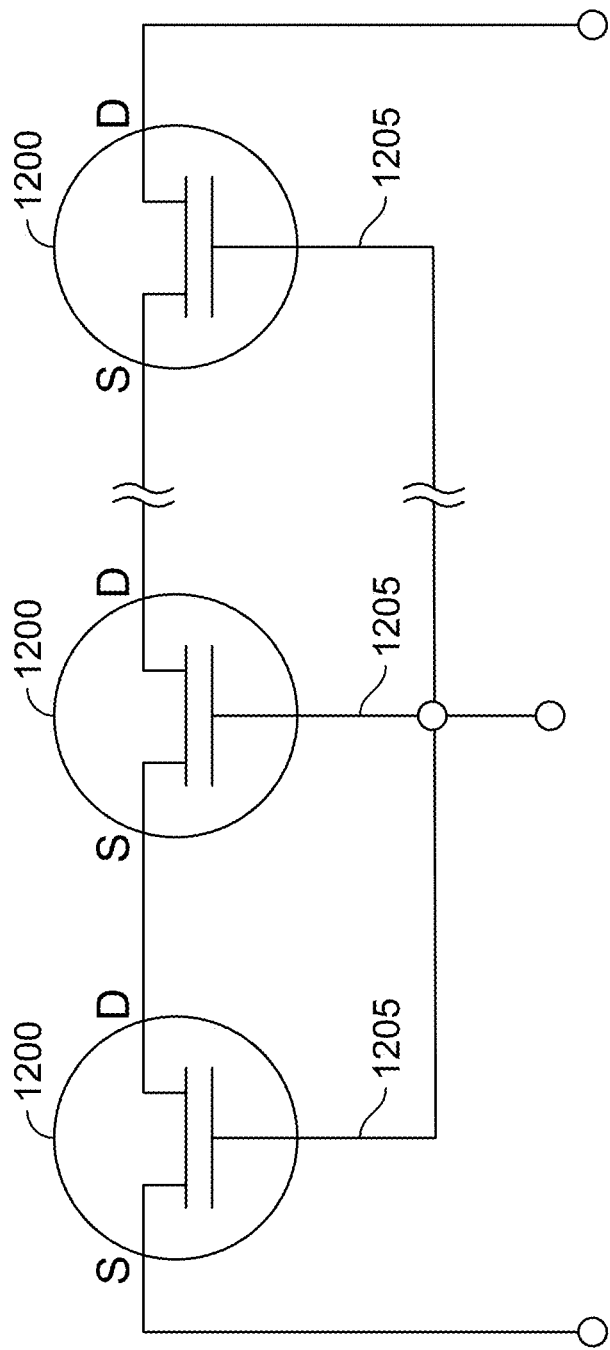
FIG. 12 is a schematic diagram illustrating a stacked configuration of transistors that may be useful for practicing the invention in some embodiments.

In general, the greatest cooling efficiency will be achieved by the longest transistor structure because the temperature gradient $\Delta T$ is maximized by maximizing the separation between the hot and cold sides. To increase the effective transistor length, a stacked arrangement can be created by shorting a plurality of transistors via their gate connections. Such an arrangement is shown schematically in FIG. 12, where a plurality of FETs 1200 are connected in series, with all of their gate contacts 1205 connected together.

However, the resulting thermal short circuits will limit the effective device length to values much smaller than the actual length. Hence the best design tradeoffs will probably involve stacked arrangements of transistors that individually have been made as long as practicable in view of design rules and fabrication limits.

For at least some practical applications, it will be advantageous to cascade the MOSFET pairs in a pyramidal configuration. In a typical pyramidal configuration, such as is well known in the art for arranging conventional thermoelectric elements, the MOSFET pairs are arranged in two or more stages. Pairs are thermally parallel within each stage, and the stages are in thermal series with each other. We believe that by arranging a sufficient number of MOSFETs in a pyramidal configuration, it would be possible to sustain a temperature differential $\Delta T$ as high as 30° C. or even higher.

One potentially important application for a cooling arrangement as described here is for transistor cooling, and another is for bolometer cooling. In both cases, there is a noise component that is proportional to temperature. That is, transistor noise is proportional to the ratio of temperature to the square root of the drain current, i.e. to $T/\sqrt{I_D}$, and resistive noise in a bolometer is 4kT-limited.

Although the above discussion has been directed to the silicon and SiGe material systems, it has not been our intent to exclude other possible material systems. For example, III-V systems such as GaN, InGaN, and AlGaN are known to support 2D electron gases. For that reason, we believe that the ideas presented here are applicable to those and similar material systems. Integrated thermoelectric cooling is of special interest in III-V systems because of their suitability for optoelectronic applications. For example, it would be very useful to implement the ideas presented here in a III-V material system for cooling a focal-plane array.

Figure 13:
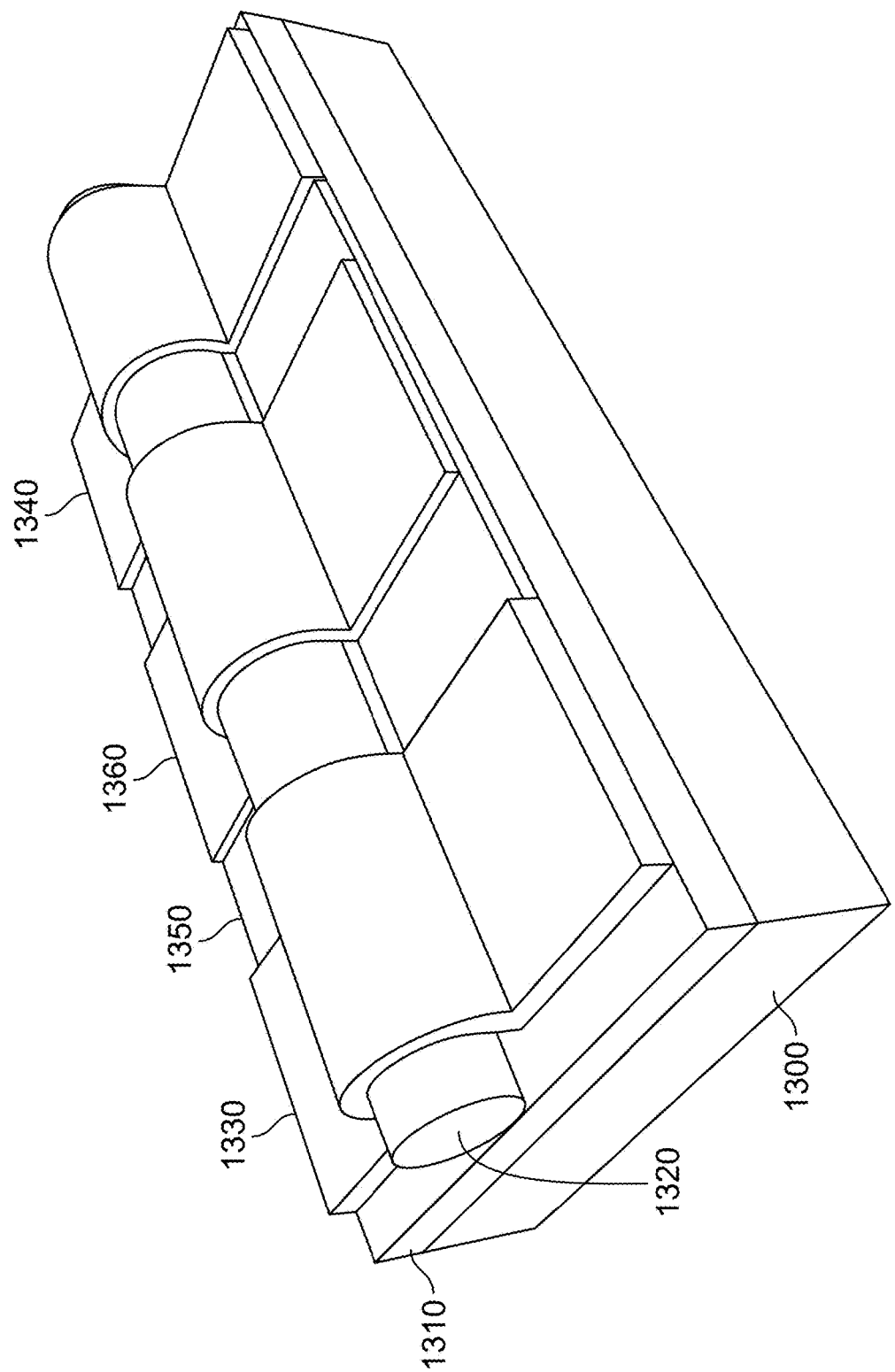
FIG. 13 provides a partially schematic, perspective view of an axially doped n-p-n silicon or SiGe nanowire FET having an omega gate (i.e., a partially wraparound gate). Such an FET is useful in implementations of the present invention.

FIG. 13 provides a partially schematic, perspective view of an axially doped n-p-n silicon or SiGe nanowire FET having an omega gate (i.e., a partially wraparound gate). Indicated in the figure are substrate 1300, oxide layer 1310, silicon or SiGe nanowire 1320, source and drain contacts 1330, 1340, gate dielectric 1350, and gate electrode 1360. In the implementation depicted in the figure, the nanowire is axially doped; that is, the doping profile is modulated in the longitudinal direction.

An axially doped n-p-n (or alternatively, p-n-p) SiGe nanowire such as nanowire 1320 of FIG. 13 can be grown by catalyst-assisted chemical vapor deposition according to known methods. The dopant profile is modulated by controlling flows of dopant precursors. Any metal that forms a eutectic alloy with silicon and germanium can be employed to grow SiGe nanowires.

Gold is a typical catalyst for SiGe nanowire growth. The most common precursors for silicon, germanium, n-type dopant, and p-type dopant are silane, germane, phosphine, and diborane, respectively. Alternative multivalent gases such as disilane can also be used. The precursors are typically diluted in hydrogen or helium. The diameter and length of the resulting SiGe wires are controlled by the size of the catalyst and the growth time, respectively. The SiGe alloy composition is controlled by controlling the growth temperature and the silane/germane ratio. The composition can be tuned from 100% Si to 100% Ge. The catalyst can be subsequently removed by an in situ or ex situ metal etching process.

A radially doped nanowire may be used in alternative implementations. To prepare, e.g., a radially doped SiGe nanowire, a SiGe wire is grown by catalyst-assisted chemical vapor deposition. Then a doped SiGe shell is grown in the radial direction. Feasible compositions and control of the composition are as described above.

An exemplary process for creating a nanowire FET such as the FET of FIG. 13 begins by depositing a thin layer of thermal oxide at most 100 nm thick on a silicon substrate. The thermal oxide layer is patterned with alignment markers that will be used later for determining the positions of translocated nanowires.

Nanowires that have been removed from their growth substrates are then translocated onto the FET substrate. For example, the growth substrate can be immersed in isopropanol and sonicated for about five minutes to release the nanowires into suspension. The nanowires are then placed onto the FET substrate, e.g. by dropcasting. In an exemplary dropcasting procedure, four or five drops of the suspension are placed on the substrate and dried. Alternatively, a nanomanipulator can be used to lift nanowires directly from the growth substrate and transfer them.

The transferred nanowires are located relative to the alignment markers on the FET substrate using optical or scanning electron microscopy. Source and drain contacts are then added to selected nanowires and patterned using electron-beam evaporative metal deposition and electron-beam lithography. The dielectric layer for the omega-shaped gate is then added by atomic layer deposition. A typical dielectric layer is about 10 nm of aluminum oxide.

The p-n junctions are then located using scanning capacitance microscopy. The gate contact over the p-type segment in each n-p-n nanowire or the over the n-type segment in each p-n-p nanowire is then added and patterned using electron-beam evaporative metal deposition and electron-beam lithography. The gate dielectric is then removed from regions overlying the probe pads by electron-beam lithography and a quick buffered oxide etch.

Techniques of gate formation similar to those described above may be found in the following publication, the entirety of which is hereby incorporated herein by reference: C. J. Delker et al., "Current and Noise Properties of InAs Nanowire Transistors With Asymmetric Contacts Induced by Gate Overlap," *IEEE Trans. Electr. Dev.* 61 (March 2014) 884-889.

Figure 14:
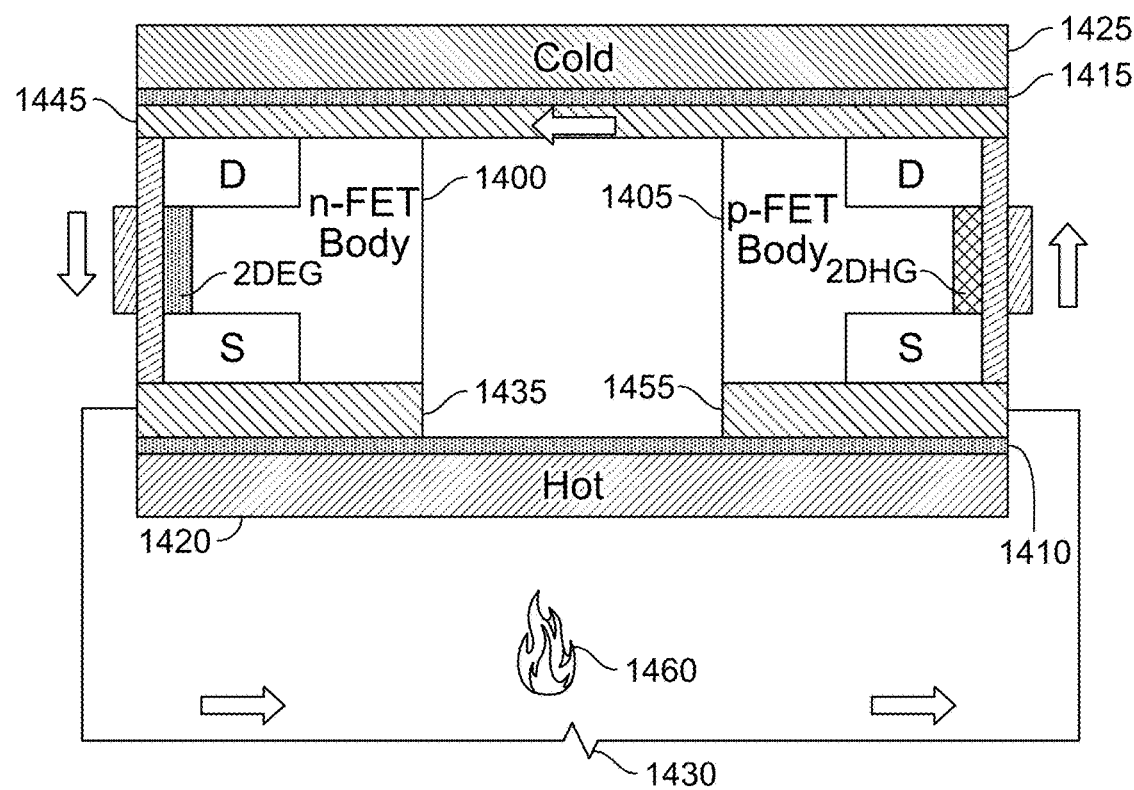
FIG. 14 provides a schematic diagram illustrating a cooling arrangement of two MOSFETs similar to the arrangement of FIG. 9. However, in FIG. 14 the MOSFETs are arranged for an alternative mode of operation whereby the MOSFETs generate electric power.

FIG. 14 provides a schematic diagram illustrating a cooling arrangement of two MOSFETs similar to the arrangement of FIG. 9. However, in FIG. 14 the MOSFETs are arranged for an alternative mode of operation in which the MOSFETs generate electric power. The arrangement of FIG. 14 includes re-channel FET 1400 and p-channel FET 1405, both of which are enclosed between thin insulating sheets 1410, 1415 and respective hot-side and cold-side metal plates 1420, 1425. When hot-side plate 1420 is heated by external heat source 1460, electric current passes from n-channel FET 1400, through contact 1435 into resistive load 1430, from there through contact 1455 into FET 1405, and from there through conductor 1445 back into FET 1400.

We claim:

1. Apparatus for removing heat from an object, the apparatus comprising at least one pair of field-effect transistors (FETs) consisting of an n-channel FET and a p-channel FET, said at least one pair of FETs operated under inversion via an induced inversion channel and connected in a thermally parallel, electrically series arrangement, wherein each pair from said at least one pair of FETs is thermally connected at one end to the object that in operation is a source of heat and at the other end to a heat-dissipating element, and wherein, in each pair from said at least one pair of FETs:

the n-channel FET and the p-channel FET are each fabricated in an SOI wafer having a device layer at most 100 nm thick from a top to a bottom of the device layer;

the n-channel FET and the p-channel FET each have a respective gate electrode that extends to the bottom of the device layer;

the n-channel FET and the p-channel FET each have a channel region controlled by a respective gate electrode, wherein the channel region is positioned laterally with respect to at least part of said channel region respective controlling gate electrode and consists of one or more channels;

each of the channels has a thickness from the top to the bottom of the device layer, a channel length in a longitudinal direction for electrical conduction, and a channel width in a transverse direction perpendicular to the longitudinal direction for electrical conduction;

in each of the channels, the channel length is greater than 100 nm; and in each of the channels, the channel length is more than five times the channel width.

2. The apparatus of claim 1, wherein said at least one pair of FETs are configured to operate under an applied gate voltage that induces the inversion channel in each said FET.

3. The apparatus of claim 1, wherein each FET comprises a permanent gate charge that induces the inversion channel.

4. The apparatus of claim 1, comprising two or more thermally parallel stages, wherein said at least one pair of FETs connected in the thermally parallel and electrically series arrangement comprises a plurality of pairs of FETs connected in the thermally parallel and electrically series arrangement, and wherein each stage includes at least one said pair from the plurality of pairs of FETs connected in the thermally parallel and electrically series arrangement.

5. The apparatus of claim 1, wherein the heat-source object is a functional electronic or optoelectronic circuit.

6. The apparatus of claim 5, conformed as a monolithically integrated circuit including the functional electronic or optoelectronic circuit.

7. The apparatus of claim 1, wherein said at least one pair of FETs are FinFETs.

8. The apparatus of claim 7, wherein at least one of said FinFETs has a gate that controls three conduction channels.

9. The apparatus of claim 1, wherein said at least one pair of FETs have a semiconductor composition that is substantially silicon-germanium alloy.

10. The apparatus of claim 1, comprising a semiconductor die having three or more sides wherein at least one side is constructed as an array with said at least one pair of FETs such that n-channel FETs alternate with p-channel FETs in the array.

11. The apparatus of claim 1, wherein the gate electrode of each FET is configured to control two or more conduction channels within the respective FET of said gate electrode.

12. The apparatus of claim 1, wherein said at least one pair of FETs are connected to an electric power source from which power is drawn during operation of the apparatus, and wherein the apparatus is configured to cool the heat-source object.

13. The apparatus of claim 1, configured as a power source for supplying electric current to a resistive load connected to said at least one pair of FETs in response to the conduction of heat from the heat-source object through a body portion of each FET of said at least one pair of FETs.

14. Apparatus for removing heat from a heat-source object, comprising at least a first stack of n-channel FETs and at least a second stack of p-channel FETs, wherein:
  each n-channel FET in the first stack and each p-channel FET in the second stack is operated under inversion via an induced inversion channel;
  the FETs within the first stack are thermally series-connected and have their gate electrodes shorted to each other;
  the FETs within the second stack are thermally series-connected and have their gate electrodes shorted to each other;
  the first stack is connected to the second stack in a thermally parallel, electrically series arrangement to form a stack pair;
  the stack pair is thermally connected at one end to the heat-source object and at the other end to a heat-dissipating element;
  the n-channel FETs in the first stack and the p-channel FETs in the second stack are each fabricated in an SOI wafer having a device layer at most 100 nm thick from a top to a bottom of the device layer;
  the n-channel FETs in the first stack and the p-channel FETs in the second stack each have a respective gate electrode that extends to the bottom of the device layer;
  the n-channel FETs in the first stack and the p-channel FETs in the second stack each have a channel region controlled by a respective gate electrode, which each said channel region is positioned laterally with respect to at least part of said channel region respective controlling gate electrode and consists of one or more channels;
  each of the channels has a thickness from the top to the bottom of the device layer, a channel length in a longitudinal direction for electrical conduction, and a channel width in a transverse direction perpendicular to the longitudinal direction for electrical conduction;
  in each of the channels, the channel length is greater than 100 nm; and
  in each of the channels, the channel length is more than five times the channel width.

* * * * *